United States Patent [19]

Watanabe et al.

[11] Patent Number: 4,967,395

[45] Date of Patent: Oct. 30, 1990

[54] DRAM WITH (½)VCC PRECHARGE AND SELECTIVELY OPERABLE LIMITING CIRCUIT

[75] Inventors: Yohji Watanabe, Kawasaki; Tohru Furuyama, Tokyo, both of Japan

[73] Assignee: Kabushiki Kaisha Toshiba, Kawasaki, Japan

[21] Appl. No.: 304,173

[22] Filed: Jan. 31, 1989

[30] Foreign Application Priority Data

Mar. 15, 1988 [JP]  Japan ................................. 63-61384

[51] Int. Cl.$^5$ ............................................. G11C 11/34
[52] U.S. Cl. ................................ 365/203; 365/189.06; 365/189.07
[58] Field of Search ............... 365/203, 189.06, 189.07, 365/189.09; 307/350, 351, 358

[56] References Cited

U.S. PATENT DOCUMENTS

| 4,780,850 | 10/1988 | Miyamoto et al. | 365/203 |
| 4,785,427 | 11/1988 | Young | 365/189.06 |
| 4,821,237 | 4/1989 | Iwahashi | 365/189.06 |

*Primary Examiner*—Joseph A. Popek
*Assistant Examiner*—Michael A. Whitfield
*Attorney, Agent, or Firm*—Oblon, Spivak, McClelland, Maier & Neustadt

[57] ABSTRACT

An amplitude limiting circuit is arranged in a DRAM with (½) VCC precharge to equalize an amplitude between a precharge voltage and an "H" level output of each pair of bit lines charged and discharged in an active cycle with an amplitude of the precharge voltage and an "L" level output of each pair of bit lines.

7 Claims, 7 Drawing Sheets

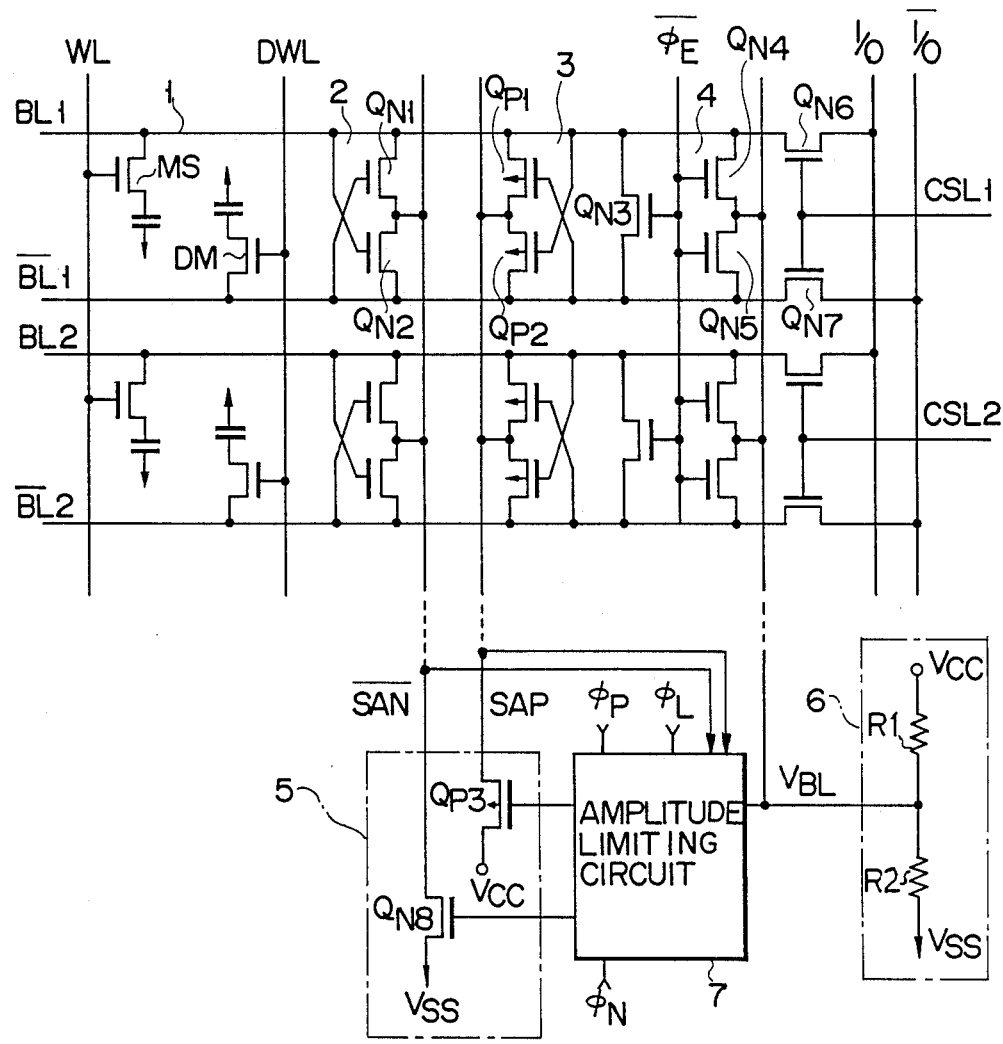
F I G. 1

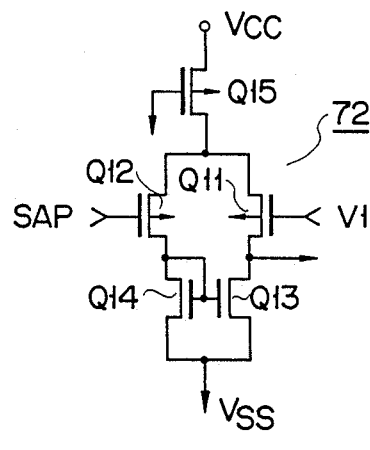
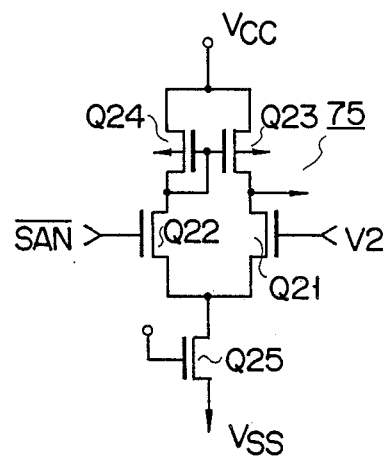
F I G. 3          F I G. 4
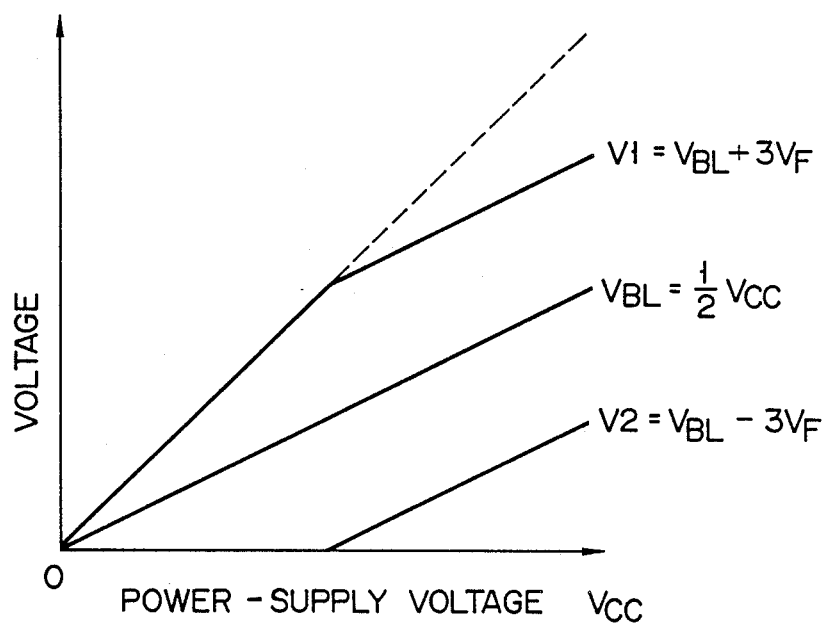
F I G. 5

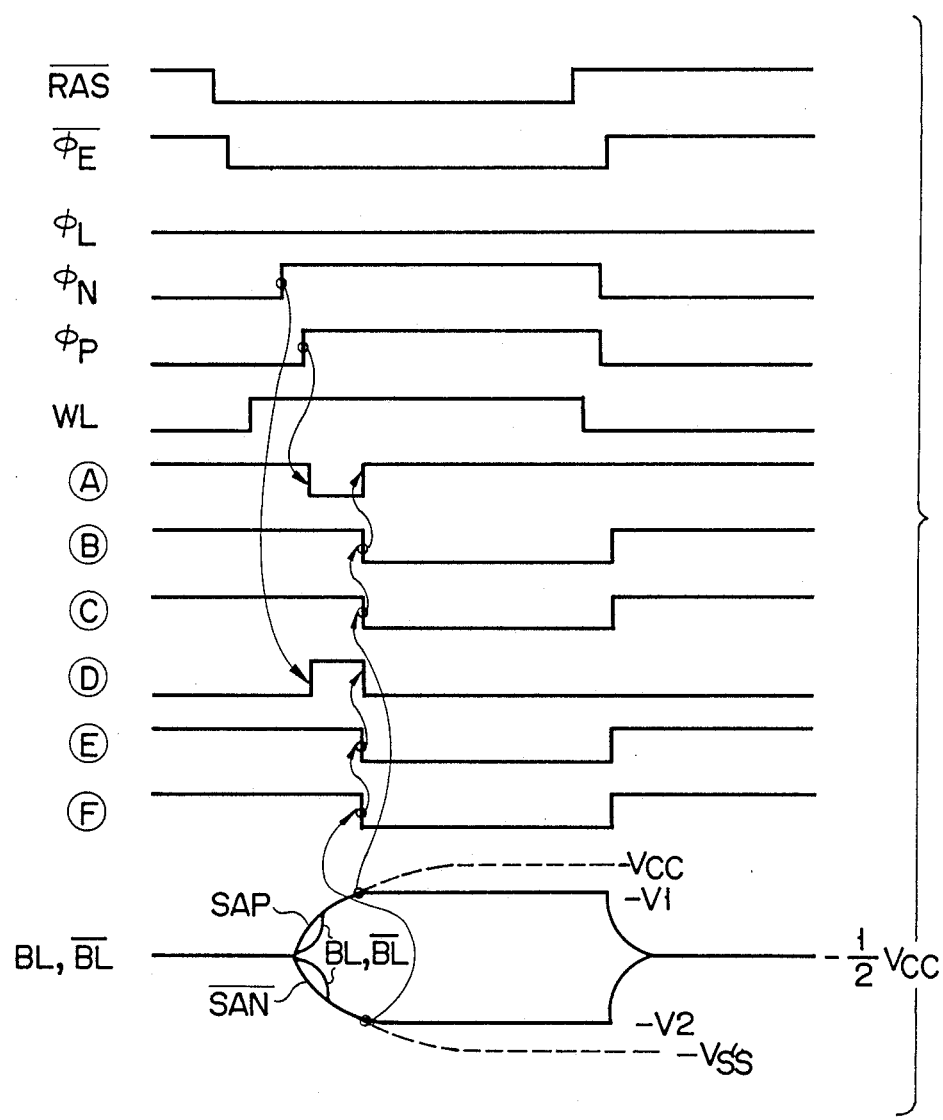
F I G. 6

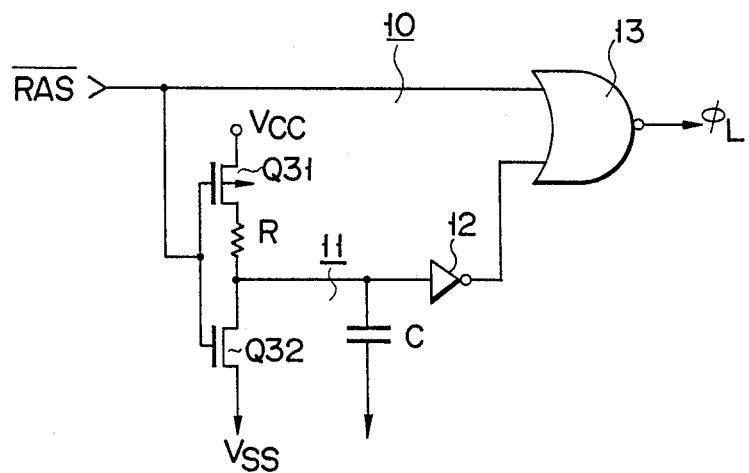
F I G. 7
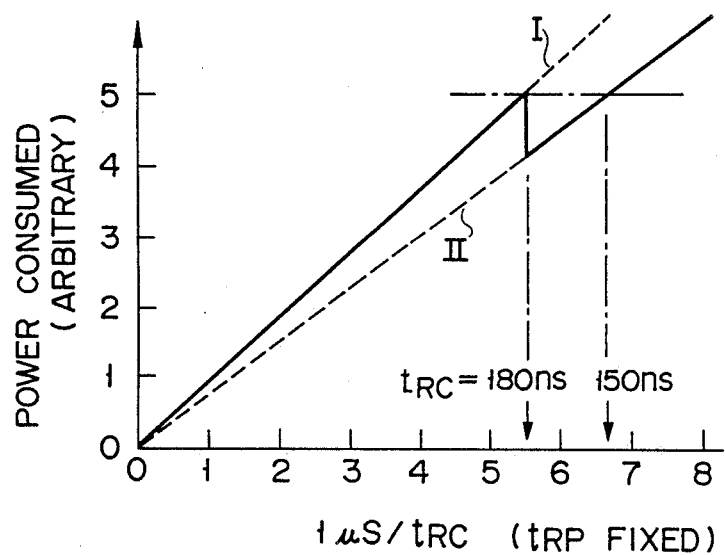
F I G. 9

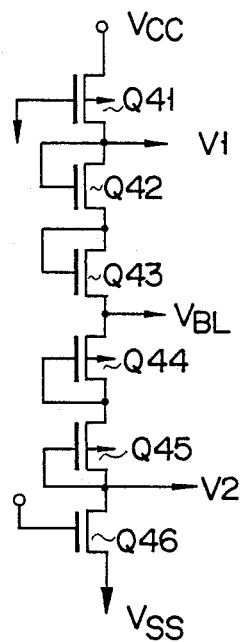
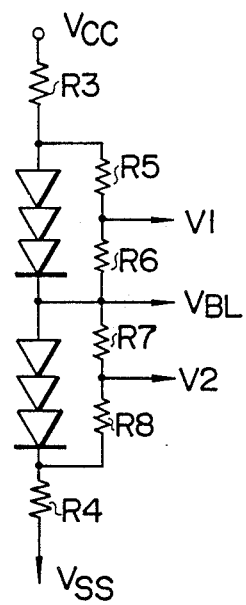
F I G. 10          F I G. 11

DRAM WITH (½)VCC PRECHARGE AND SELECTIVELY OPERABLE LIMITING CIRCUIT

BACKGROUND OF THE INVENTION

1. Field of the Invention

The present invention relates to a MOS dynamic RAM (DRAM) and, more particularly, to a DRAM with (½) $V_{CC}$ precharge.

2. Description of the Prior Art

It is very important to reduce the power consumed by a DRAM and to shorten the response time in order to arrange a high-density DRAM. In the active state of a DRAM, a large number of bit line pairs are simultaneously charged and discharged. Several hundreds to several thousands of bit line pairs which are simultaneously charged and discharged in a recent high-density DRAM. The charge/discharge current consumption of the bit lines is 50% or more of the entire power consumed by the DRAM. In order to reduce the charge and discharge currents of the bit lines, a (½) $V_{CC}$ precharge scheme is employed to precharge the bit lines to (½) $V_{CC}$. Another technique for reducing charge and discharge currents of bit lines in a DRAM is available to charge and discharge the bit lines in units of sub cell arrays. However, this technique undesirably results in an increase in chip size.

Still another technique is proposed by M. Takada wherein a limiter circuit for setting a bit line charge level to a voltage lower than the power-supply voltage $V_{CC}$ so as to reduce bit line charge and discharge currents of the DRAM and assure reliability of micro-patterned MOS transistors (IEEE JOURNAL OF SOLID-STATE CIRCUITS, VOL. sc-21, NO. 5, Oct., 1986). According to this technique, low internal voltage $V_{BLS}$, lower than external power-supply voltage $V_{CC}$ is used to precharge bit lines to a voltage of (½) $V_{BLS}$ lower than (½) $V_{CC}$.

This technique, however, has the following drawbacks. First, since the precharge voltage is lower than (½) $V_{CC}$, i.e., since the operation center of bit line charging/discharging is lowered, the operation margin of a bit line sense amplifier is decreased. A DRAM bit line sense amplifier comprises: a PMOS sense amplifier constituted by a flip-flop consisting of two p-channel MOS transistors to amplify a signal of "H" level; and an NMOS sense amplifier constituted by a flip-flop consisting of two n-channel MOS transistors to amplify a signal of "L" level. In this bit line sense amplifier, when a precharge voltage is set at a voltage lower than (½) $V_{CC}$, the gate-source voltage of these sense amplifiers are lowered. In particular, a decrease in operating margin of the NMOS sense amplifier which amplifies the "L" level signal degrades circuit reliability. Second, when internal voltage $V_{BLS}$ is fixedly used as a power supply, a forcible acceleration test for testing reliability of a DRAM upon application of a high voltage to an external power supply $V_{CC}$ terminal cannot be performed. In addition, since internal voltage $V_{BLS}$ is used as an "H" level voltage in place of external power-supply voltage $V_{CC}$, a complicated circuit for stabilizing internal voltage $V_{BLS}$ is required.

SUMMARY OF THE INVENTION

It is an object of the present invention to provide a DRAM with (½) $V_{CC}$ precharge, wherein bit line charge and discharge amplitudes are limited without decreasing the operating margin, thereby reducing power consumed by the DRAM.

It is another object of the present invention to provide a DRAM with (½) $V_{CC}$ precharge, wherein charge and discharge amplitudes of bit lines are limited to reduce power consumed by the DRAM, and a high voltage is applied to an external power-supply terminal to be able to perform an acceleration test.

According to the present invention, there is provided an amplitude limiting circuit for limiting an "H" level amplitude variation of a pair of bit lines which is charged from the precharge voltage level by a bit line sense amplifier, and for limiting an "L" level potential amplitude variation of the pair of bit lines which is discharged from the precharge voltage level by the bit line sense amplifier, so that the absolute value of each of the respective "H" and "L" level potential amplitude variations are equal to one another and are also equal to a voltage value less than the absolute value of ½ a power-supply voltage.

In a DRAM with (½) $V_{CC}$ precharge according to the present invention, there is provided the above amplitude limiting circuit and a timer circuit for canceling a function of the amplitude limiting circuit when a predetermined period of time has elapsed upon starting an RAS active period.

According to the present invention, the bit line to be (½) $V_{CC}$, an "H" level bit line voltage upon readout of data is amplitude-limited to be (½) $V_{CC}$ + $\Delta V$, and an "L" level bit line voltage is amplitude-limited to be (1/2) $V_{CC}$ − $\Delta V$. Therefore, a stable internal power-supply voltage in place of an external power-supply voltage need not be used, and a complicated circuit need not be used. In addition, the bit line precharge voltage can be equal to a conventional precharge voltage (i.e., (½) $V_{CC}$) and the operating margin of the bit line sense amplifier is not decreased.

In addition, since the timer circuit is provided, the function of the amplitude limiting circuit can be controlled in accordance with the length of time of a DRAM operation cycle. Therefore, when a long cycle which does not pose any problem on power consumed by the DRAM, the function of the amplitude limiting circuit is canceled to change a bit line potential from $V_{CC}$ to $V_{SS}$. In this case, a forcible acceleration test upon application of a high voltage can be performed.

The present invention will be described with reference to preferred embodiments in conjunction with the accompanying drawings.

BRIEF DESCRIPTION OF THE DRAWINGS

FIG. 1 is a circuit diagram of a DRAM according to an embodiment of the present invention;

FIGS. 3 and 4 are circuit diagrams showing arrangements of voltage comparators shown in FIG. 2;

FIG. 5 a graph showing output characteristics of a voltage setting circuit shown in FIG. 2;

FIG. 6 is a timing chart for explaining an operation of the DRAM shown in FIG. 1;

FIG. 7 is a circuit diagram of a timer circuit used in a DRAM according to another embodiment of the present invention;

FIG. 9 is a graph showing the relationship between the power consumed by the DRAM and cycle time of the DRAM shown in FIG. 7; and FIGS. 10 and 11 are circuit diagrams showing other arrangements of a voltage generator.

DETAILED DESCRIPTION OF THE PREFERRED EMBODIMENTS

Figure 2:
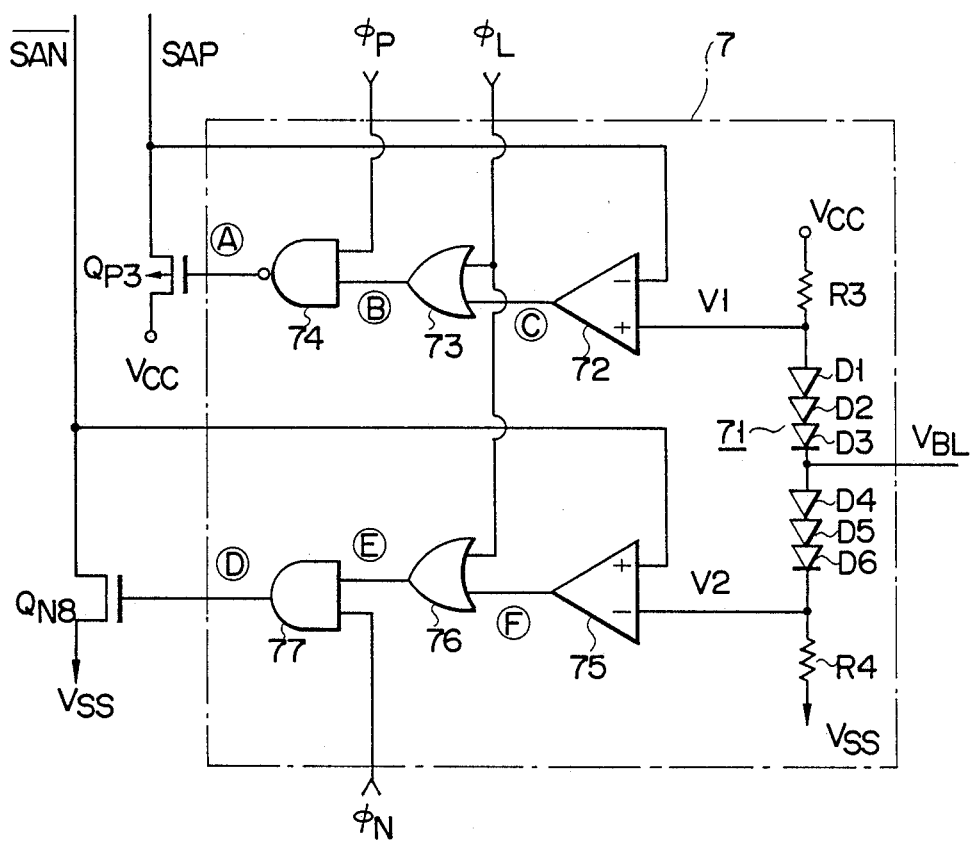
FIG. 2 is a circuit diagram presenting an amplitude limiting circuit shown in FIG. 1.

Referring to FIG. 1, memory array 1 comprises a plurality of bit line pairs, a plurality of word lines arranged to intersect the plurality of bit line pairs, and dynamic memory cells each consisting of one MOS transistor and one capacitor which are arranged at each intersection between the corresponding bit and word lines. FIG. 1 illustrates only two pairs of bit lines BL and $\overline{BL}$ (i.e., $BL_1$ and $\overline{BL_1}$, and $BL_2$ and $\overline{BL_2}$) selected by column selection signal lines CSL (i.e., $CSL_1$ and $CSL_2$), one word line WL, one dummy word line DWL, and memory cells MS and dummy cells DM which are located at corresponding intersections. A memory array in a large-capacity DRAM is generally divided into a plurality of sub cell arrays. Illustrated memory array 1 is one of the sub cell arrays of such a DRAM. A pair of NMOS and PMOS sense amplifiers 2 and 3 are arranged at ends of each pair of bit lines BL and $\overline{BL}$. NMOS sense amplifier 2 comprises a flip-flop constituted by two n-channel MOS transistors $Q_{N1}$ and $Q_{N2}$. PMOS sense amplifier 3 comprises a flip-flop constituted by p-channel MOS transistors $Q_{p1}$ and $Q_{p2}$. Common source nodes $\overline{SAN}$ and SAP of NMOS and PMOS sense amplifiers 2 and 3 are connected to enabling circuit 5. Enabling circuit 5 comprises n-channel MOS transistor $Q_{N8}$ for connecting common source node $\overline{SAN}$ of NMOS sense amplifier 2 to ground potential $V_{SS}$ in an active state, and p-channel MOS transistor $Q_{p3}$ for connecting common source node SAP of PMOS sense amplifier 3 to power-supply voltage $V_{CC}$ in the active state.

Equalizer circuit 4 is connected to each pair of bit lines BL and $\overline{BL}$ to equalize the potentials thereof. Equalizer circuit 4 comprises n-channel MOS transistor $Q_{N3}$ for short-circuiting the pair of bit lines BL and $\overline{BL}$, and n-channel MOS transistors $Q_{N4}$ and $Q_{N5}$ for applying precharge voltage $V_{BL}$ to the pair of bit lines BL and $\overline{BL}$. The pair of bit lines BL and $\overline{BL}$ are connected to input/output lines I/O and $\overline{I}/$ through n-channel MOS transistors $Q_{N6}$ and $Q_{N7}$ which constitute a transfer gate controlled by column selection signal line CSL.

Precharge voltage generator 6 comprises two series-connected resistors $R_1$ and $R_2$ between power-supply voltage $V_{CC}$ and ground potential $V_{SS}$. The resistance of resistor $R_1$ is equal to that of resistor $R_2$. Precharge voltage generator 6 generates precharge voltage $V_{BL}$ =($\frac{1}{2}$) $V_{CC}$. An output from precharge voltage generator 6 is supplied to the pair of bit lines BL and $\overline{BL}$ through equalizer circuit 4 controlled by clock $\overline{\phi_E}$. Therefore, precharge voltage generator 6 and equalizer circuit 4, arranged for each pair of bit lines BL and $\overline{BL}$, constitute a bit line precharge circuit.

Amplitude limiting circuit 7 is arranged between precharge voltage generator 6 and bit line enabling circuit 5. Amplitude limiting circuit 7 serves to drive enabling circuit 5 in the bit line sense amplifier in an active cycle and to limit charge and discharge amplitudes to predetermined levels. More specifically, amplitude limiting circuit 7 limits an "H" level potential amplitude variation and an "L" level potential amplitude variation of the pair of bit lines BL and $\overline{BL}$ charged and discharged respectively relative to the precharge voltage by the bit line sense amplifier so that the absolute value of each of the respective "H" and "L" level potential amplitude variations from the precharged voltage are equal to each other as well as to a voltage value less than the absolute value of ($\frac{1}{2}$)$V_{CC}$. In this embodiment, an arrangement of amplitude limiting circuit 7 is shown in FIG. 2.

Referring to FIG. 2, voltage generator 71 receives precharge voltage $V_{BL}$ output from precharge voltage generator 6 as a reference voltage and outputs "H" level upper limit voltage $V_1$ which is higher than precharge voltage $V_{BL}$ by a predetermined value and "L" level lower limit voltage $V_2$ which is lower than the precharge voltage $V_{BL}$. More specifically, voltage generator 71 comprises a series circuit of resistor $R_3$, diodes $D_1$ to $D_6$, and resistor $R_4$ between power-supply voltage $V_{CC}$ and ground potential $V_{SS}$. Precharge voltage $V_{BL}$ is applied between diodes $D_3$ and $D_4$. Resistances of resistors $R_3$ and $R_4$ are determined such that a potential difference between upper limit voltage $V_1$ and precharge voltage $V_{BL}$ and a potential difference between lower limit voltage $V_2$ and precharge voltage $V_{BL}$ are kept constant regardless of the magnitude of power-supply voltage $V_{CC}$. That is, when the resistances of resistors $R_3$ and $R_4$ are set at sufficiently large values, the following equations are established in a predetermined $V_{CC}$ range, as shown in FIG. 5:

$$V_1 = V_{BL} + 3V_F$$
$$V_2 = V_{BL} - 3V_F$$

where $V_F$ is forward voltage drop per diode (i.e., one of diodes $D_1$ to $D_6$).

Voltage comparator 72 detects a coincidence between upper limit voltage $V_1$ as one output from voltage generator 71 and a voltage at common source node SAP of PMOS sense amplifier 3. Voltage comparator 75 detects a coincidence between lower limit voltage $V_2$ as the other output from voltage generator 71 and a voltage at common source node $\overline{SAN}$ of NMOS sense amplifier 2. In other words, when the voltage at common source node SAP is higher than upper limit voltage $V_1$, the output from comparator 72 is inverted. The inverted output from comparator 72 is used to turn off enabling MOS transistor $Q_{p3}$ of PMOS sense amplifier 3 through OR gate 73 and NAND gate 74. When the voltage at common source node $\overline{SAN}$ is lower than lower limit voltage $V_2$, the output from comparator 75 is inverted. This inverted output from comparator 75 is used to turn off enabling MOS transistor $Q_{N8}$ of NMOS sense amplifier 2 through OR gate 76 and AND gate 77. The voltage at common source node SAP of PMOS sense amplifier 3 is not increased up to $V_{CC}$ even in the active state but is actually increased to upper limit voltage $V_1$. The voltage at common source node $\overline{SAN}$ of NMOS sense amplifier 2 is not decreased down to $V_{SS}$ but is actually decreased to lower limit voltage $V_2$. As a result, the charge and discharge levels of the pair of bit lines BL and $\overline{BL}$ are limited.

Clock $\phi_P$ input to NAND gate 74 and clock $\phi_N$ input to AND gate 77 are sense amplifier enable signals. Clock $\phi_L$ input to OR gates 73 and 76 is a signal for canceling the function of amplitude limiting circuit 7.

Voltage amplifiers 72 and 75 preferably comprise current mirror differential amplifiers shown in FIGS. 3 and 4, respectively, since their signal levels are different from each other. More specifically, voltage comparator 72 comprises a differential amplifier consisting of p- channel MOS transistors $Q_{11}$ and $Q_{12}$ serving as driver transistors in order to detect a coincidence on the "H" level side. Voltage comparator 75 comprises a differential amplifier consisting of n-channel MOS transistors $Q_{21}$ and $Q_{22}$ serving as driver transistors in order to detect a coincidence on the "L" level side.

An operation of the DRAM having the arrangement described above will be described with reference to FIG. 6. Assume that clock $\phi_L$ for canceling the function of amplitude limiting circuit 7 is set at "L" level. In an RAS precharge cycle in which row address strobe signal $\overline{RAS}$ is set at "H" level, equalizer clock $\overline{\phi_E}$ is set at "H" level. In this case, all MOS transistors $Q_{N3}$, $Q_{N4}$, and $Q_{N5}$ constituting equalizer circuit 4 are kept on. The pair of bit lines BL and $\overline{BL}$ are precharged such that the potential of bit line BL is equal to that of bit line $\overline{BL}$ to be $V_{BL} = (\frac{1}{2}) V_{CC}$ by precharge voltage generator 6. When signal $\overline{RAS}$ goes low to set the $\overline{RAS}$ active cycle, clock $\overline{\phi_E}$ goes low, and the pair of bit lines BL and $\overline{BL}$ are set in a floating state. Word line WL selected by a row decoder (not shown) is set at "H" level, and information charge of memory cell MS along selected word line WL is read out to one bit line BL. At the same time, dummy word line DWL is set at "H" level, and the information charge of dummy cell DM is read out to the other bit line $\overline{BL}$.

When enable clock signals $\phi_N$ and $\phi_P$ of bit line sense amplifiers 2 and 3 to go high, a sensing operation is started. In this state, output node A of NAND gate 74 is set at "L" level, and output node D of AND gate 77 is set at "H" level, so that enabling MOS transistors $Q_{p3}$ and $Q_{N8}$ are turned on. A voltage at common source node $\overline{SAN}$ of NMOS sense amplifier 2 is lowered, and one of the pair of bit lines BL and $\overline{BL}$ is discharged by NMOS sense amplifier 2 in accordance with the information. At the same time, the other bit line is charged by PMOS sense amplifier 3. While the voltage at common source node SAP is lower than "H" level output upper limit voltage $V_1$ from voltage generator 71 and the voltage at common source node $\overline{SAN}$ is higher than "L" level output lower limit voltage $V_2$ from voltage generator 71, output nodes C and F of voltage comparators 72 and 75 are kept at "H" level, and the pair of bit lines BL and $\overline{BL}$ are kept charging and discharging. Charge and discharge operations are performed within a predetermined period of time and the voltages at common source node $\overline{SAN}$ of NMOS sense amplifier 2 and on the "L" level bit line are lowered. When the voltage at common source node $\overline{SAN}$ is lower than voltage $V_2$, an output from voltage comparator 75 is inverted. When voltages at common source node SAP of PMOS sense amplifier and on the "H" level bit line are increased to be higher than $V_1$, an output from voltage comparator 72 is inverted. In this embodiment, these output inversion operations are simultaneously performed. An inverted output from voltage comparator 75 is transmitted to the gate of enabling MOS transistor $Q_{p3}$ of PMOS sense amplifier 4 through OR gate 73 and NAND gate 74. MOS transistor $Q_{p3}$ is therefore turned off. An inverted output from voltage comparator 75 is transmitted to the gate of enabling MOS transistor $Q_{N8}$ of NMOS sense amplifier 2 through OR gate 76 and AND gate 77. MOS transistor $Q_{N8}$ is therefore turned off. Regarding charging and discharging of the pair of bit lines BL and $\overline{BL}$, the "H" level bit line is set at $V_1$, while the "L" level bit line is set at $V_2$.

Thereafter, when signal $\overline{RAS}$ is set at "H" level again to set a precharge cycle, word line WL and dummy word line DWL are set at "L" level, and memory cell MS and dummy cell DM are disconnected from the pair of bit lines BL and $\overline{BL}$. Clock $\overline{\phi_E}$ is set at "H" level to precharge the pair of bit lines BL and BL. In this embodiment, the absolute values of the "H" and "L" level potential amplitudes of the pair of bit lines BL and $\overline{BL}$ relative to the precharge voltage value are set to be equal to each other. That is, $$V_1 - (\tfrac{1}{2}) V_{CC} = (\tfrac{1}{2}) V_{CC} - V_2$$

Therefore, upon short-circuiting of the pair of bit lines BL and $\overline{BL}$, the potentials of the pair of bit lines BL and $\overline{BL}$ are equalized to be $V_{BL} = (\tfrac{1}{2}) V_{CC}$.

By the above operations, the signal charge to be restored in a memory cell is smaller than that of a case wherein the pair of lines BL and $\overline{BL}$ are charged and discharged between $V_{SS}$ and $V_{CC}$. According to this embodiment, however, the operating margin of the DRAM is not decreased because an operation at $V_{CC} = 5$ V $+0.5$ V is assured when a 5-V power supply is used. If voltages $V_1$ and $V_2$ are defined in the above embodiment:

$$V_1 = (\tfrac{1}{2}) V_{CC} + 2.25 \text{ (V)}$$
$$V_2 = (\tfrac{1}{2}) V_{CC} - 2.25 \text{ (V)}$$

the same operating margin as in the case wherein the pair of bit lines are charged and discharged between $V_{SS}$ and $V_{CC}$ (=4.5 V) can be obtained. If the DRAM is operated at $V_{CC} = 5.5$ V, power consumed by charging and discharging of the bit lines can be reduced by 20% or more as compared with the case wherein the bit lines are charged and discharged between $V_{SS}$ and $V_{CC}$. When an operating margin can be increased by an increase in capacity of a memory cell, "H" level upper limit voltage $V_1$ can be further decreased, and "L" level lower limit voltage $V_2$ can be further increased, thereby further reducing power consumed by the DRAM.

In the above embodiment, function control clock $\phi_L$ of amplitude limiting circuit 7 is set to be "L" level. However, when the charge and discharge voltages of the bit lines are limited as in the above embodiment, a forcible acceleration test for applying an external high voltage cannot be performed. Another embodiment which solves this problem will be described below.

A basic arrangement of a DRAM of this embodiment is substantially the same as that shown in FIGS. 1 and 2. Timer circuit 10 shown in FIG. 7 is added to the basic arrangement of the DRAM. Timer circuit 10 generates clock $\phi_L = $ "H" for canceling the function of amplitude limiting circuit 7. Timer circuit 10 comprises time constant circuit 11 including resistor R and capacitor C, inverter 12 for inverting an output from time constant circuit 11, and 2-input NOR gate 13. Row address strobe signal $\overline{RAS}$ is directly input to one input terminal of NOR gate 13. Time constant circuit 11 comprises resistor R, p-channel MOS transistor $Q_{31}$ and n-channel MOS transistor $Q_{32}$. These transistors are arranged between power-supply voltage $V_{CC}$ and ground potential $V_{SS}$. The gates of MOS transistors $Q_{31}$ and $Q_{32}$ are controlled by signal $\overline{RAS}$. When signal $\overline{RAS}$ is set at "H" level, n-channel MOS transistor $Q_{32}$ in time constant circuit 11 is kept on, and therefore an output from inverter 12 is set at "H" level. In this case, an output from NOR gate 13 is set to be $\phi_L = $ "L". When signal $\overline{RAS}$ goes low to set the active cycle, p-channel MOS transistor $Q_{31}$ of time constant circuit 11 is turned on to charge capacitor C. After a lapse of a predetermined period $\tau$, an output from inverter 12 goes low. An output from NOR gate 13 is inverted to obtain $\phi_L = $ "H".

Figure 8:
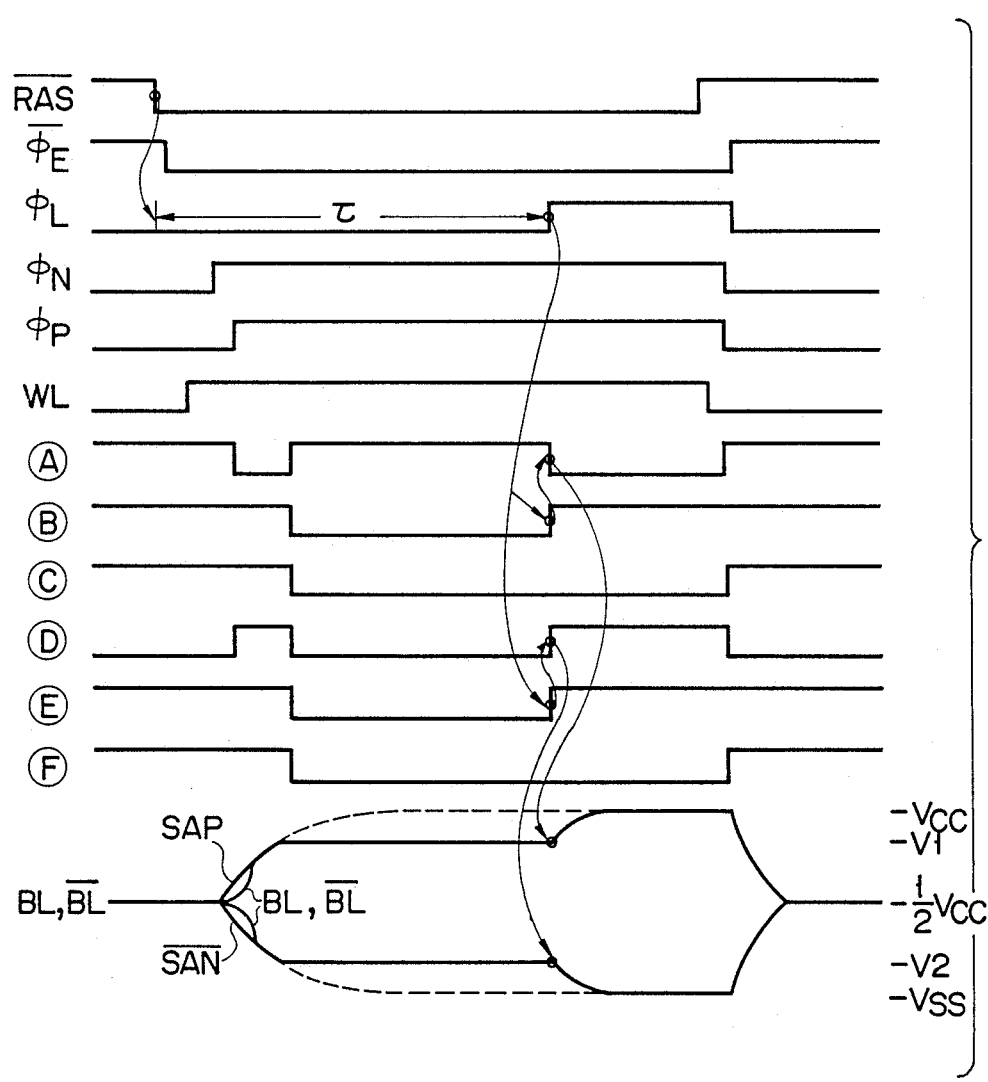
FIG. 8 is a timing chart for explaining an operation of the DRAM shown in FIG. 7.

FIG. 8 is a timing chart for explaining the DRAM incorporating this timer circuit 10. When the precharge cycle is changed into the $\overline{RAS}$ active cycle, a bit line sensing operation is started. At an initial period of the active cycle, since clock $\phi_L$ is set at "L" level, amplitude limiting circuit 7 is operated in the same manner as in the above embodiment. Therefore, charge and discharge levels of the pair of bit lines BL and $\overline{BL}$ are limited. When active duration $t_{RAS}$ in which signal $\overline{RAS}$ is set at "L" level is long, clock $\phi_L$ goes high by timer circuit 10 after a lapse of period $\tau$ upon rising of signal $\overline{RAS}$. Output nodes B and E of OR gates 73 and 76 in FIG. 2 are set at "H" level, output node A of NAND gate 74 is set at "L" level, and output node D of AND gate 77 is set at "H" level. As a result, bit line sense amplifier enabling MOS transistors $Q_{P3}$ and $Q_{N3}$ are turned on again, and charging and discharging of the pair of bit lines BL and $\overline{BL}$ start again. The "H" level side of the pair of bit lines BL and $\overline{BL}$ is increased to power-supply voltage $V_{CC}$, and its "L" level side is decreased to ground potential $V_{SS}$. When $\overline{RAS}$ active duration $t_{RAS}$ is shorter than delay period $\tau$ by timer circuit 10, the function of amplitude limiting circuit 7 is not canceled.

Power consumed by the DRAM is almost in inverse proportion to a cycle time. Power consumed by the DRAM becomes important when the DRAM is operated in a short cycle time. In this case, since $\overline{RAS}$ active duration $t_{RAS}$ is also short, the function of amplitude limiting circuit 7 is not canceled, thereby effectively reducing power consumed by the DRAM. If a cycle time is long enough not to pose a power consumption problem, the pair of bit lines BL and $\overline{BL}$ are charged and discharged between $V_{SS}$ and $V_{CC}$ in the second half of the $\overline{RAS}$ active duration, and "H" level data can be restored in the memory cell. This operation further increases the operating margin of the DRAM. When an acceleration test of the DRAM is performed, $\overline{RAS}$ active duration $t_{RAS}$ is prolonged. Therefore, the pair of bit lines can be charged and discharged between $V_{CC}$ and $V_{SS}$ in the second half of the active duration. Therefore, a test high voltage is applied to an external terminal of power-supply voltage $V_{CC}$ to perform an acceleration test.

FIG. 9 shows a relationship between power consumed by the DRAM and cycle time $t_{RC}$ when power consumed by the DRAM is reduced by 20% by amplitude limiting circuit 7. Broken line I represents a case wherein the pair of bit lines BL and $\overline{BL}$ are charged and discharged between $V_{SS}$ and $V_{CC}$. Broken line II represents a case wherein power consumed by the DRAM is reduced by amplitude limiting circuit 7. A solid line represents a relationship wherein amplitude limiting circuit 7 is operated in a short cycle time and is disabled at a long cycle time with respect to cycle time $t_{RC} = 180$ ns ($t_{RAS} = 110$ ns) as a boundary. As is apparent from the graph in FIG. 9, when cycle time $t_{RC} = 150$ ns ($t_{RAS} = 80$ ns) is given and power consumed by the DRAM is reduced by 20% as compared with the case wherein the bit lines are charged and discharged between $V_{SS}$ and $V_{CC}$, an effect of reducing maximum power consumed by the DRAM can be assured for $t_{RC} > 180$ ns ($t_{RAS} > 110$ ns) even if the function of amplitude limiting circuit 7 is canceled.

In the DRAM of this embodiment as described above, the power consumed by the DRAM, and particularly, the bit lines, can be greatly reduced. At the same time, the acceleration test for applying a high voltage can be performed without any problems. In addition, since the initial bit line voltage during bit line sensing is given as $(\frac{1}{2})V_{CC}$, the sensing margin cannot be limited by limitation of the charge and discharge amplitudes.

The present invention is not limited to the above embodiments. Voltage generator 71 in FIG. 2 comprises six diodes and two resistors which are inserted between $V_{CC}$ and $V_{SS}$. However, the number of diodes may be four or less, or eight or more. Voltage generator 71 may be arranged, as shown in FIG. 10 or 11. Referring to FIG. 10, a series circuit of two diode-connected n-channel MOS transistors $Q_{42}$ and $Q_{43}$ and p-channel MOS transistor $Q_{41}$, serving as a load resistor, is arranged on the $V_{CC}$ side, and a series circuit of two diode-connected p-channel MOS transistors $Q_{44}$ and $Q_{45}$ and n-channel MOS transistor $Q_{46}$, serving as a load, resistor is arranged on the $V_{SS}$ side. Referring to FIG. 11, voltage-dividing resistors $R_5$ to $R_8$ are added to voltage generator 71 shown in FIG. 2. With the arrangement of FIG. 11, the resistances of the voltage-dividing resistors are properly selected to generate an arbitrary voltage. Timer circuit 10 shown in FIG. 7 uses CR time constant circuit 11 as a delay circuit and signal $\overline{RAS}$ serves as a clock. However, a delay circuit constituted by, e.g., an inverter chain may be used in place of the CR time constant circuit. Another internal clock may be used in place of signal $\overline{RAS}$.

According to the present invention as has been described above, in a DRAM with $(\frac{1}{2})V_{CC}$ precharge, the bit line charge and discharge levels in the active state are limited without decreasing the operating margin, thereby reducing power consumed by the DRAM. In addition, according to the present invention, the amplitude limiting circuit is combined with the timer circuit to easily perform a reliability acceleration test upon application of a high voltage.

We claim:

1. A DRAM comprising:
   a memory array including a plurality of dynamic memory cells each consisting of one MOS transistor and one capacitor, a plurality of pairs of bit lines, arranged along a direction of a matrix of said memory cells, for exchanging information charges with said memory cells, and a plurality of word lines, intersecting said bit lines, for selecting said memory cells;
   a bit line precharge circuit including a precharge voltage generator for precharging each pair of bit lines to a $(\frac{1}{2})$ power-supply voltage;
   a plurality of bit line sense amplifiers, enabled in an active cycle, for detecting a potential difference between each of said pair of bit lines; and
   an amplitude limiting circuit for limiting a potential amplitude variation between the precharge voltage and an "H" level output of each of said pair of bit lines charged and discharged by each of said plurality of bit line sense amplifiers and for limiting a potential amplitude variation between the precharge voltage and an "L" level output of each of said pair of bit lines, so that an absolute value of each of the respective potential amplitude variations are equal to each other and are also equal to a voltage value less than an absolute value of the $(\frac{1}{2})$ power-supply voltage.

2. A DRAM according to claim 1, wherein
   each of said bit line sense amplifiers comprises a PMOS sense amplifier constituted by a flip-flop consisting of p-channel MOS transistors for charging the "H" level side of each of said pair of bit lines, said p-channel MOS transistors having a common source node connected to an "H" level power supply through an enabling p-channel MOS transistor, and an NMOS sense amplifier constituted by a flip-flop consisting of n-channel MOS transistors for discharging the "L" level side of said each pair of bit lines, said n-channel MOS transistors having a common source node connected to an "L" level power supply through an enabling n-channel MOS transistor, and said amplitude limiting circuit comprises a voltage generator for receiving an output from said precharge voltage generator as a reference voltage and generating an "H" level side upper limit voltage higher than the reference voltage by a desired value, and an "L" level side lower limit voltage lower than the reference voltage by a desired value, two comparator means for comparing the upper and lower limit voltages with corresponding potentials of said common source nodes of said PMOS and NMOS sense amplifiers respectively, and gate circuit means for controlling operations of said PMOS and NMOS sense amplifier enabling MOS transistors in accordance with outputs from said comparator means.

3. A DRAM according to claim 1, wherein the "H" level bit line potential amplitude and the "L" level bit line potential amplitude are given as predetermined values regardless of a power-supply voltage.

4. A DRAM comprising:

a memory array including a plurality of dynamic memory cells each consisting of one MOS transistor and one capacitor, a plurality of pairs of bit lines, arranged along a direction of a matrix of said memory cells, for exchanging information charges with said memory cells, and a plurality of word lines, intersecting said bit lines, for selecting said memory cells;

a bit line precharge circuit including a precharge voltage generator for precharging each pair of bit lines to a (½) power-supply voltage;

a plurality of bit line sense amplifiers, enabled in an active cycle, for detecting a potential difference between each of said pair of bit lines;

an amplitude limiting circuit for limiting a potential amplitude variation between the precharge voltage and an "H" level output of each of said pair of bit lines sense amplifiers and for limiting a potential amplitude variation between the precharge voltage and an "L" level output of each of said pair of bit lines, so that an absolute value of each of the respective potential amplitude variations are equal to each other and are also equal to a voltage value less than an absolute value of the (½) power-supply voltage; and a timer circuit for disabling an operation of said amplitude limiting circuit within a predetermined period of time in the active cycle.

5. A DRAM according to claim 4, wherein each of said bit line sense amplifiers comprises a PMOS sense amplifier constituted by a flip-flop consisting of p-channel MOS transistors for charging the "H" level side of each of said pair of bit lines, said p-channel MOS transistors having a common source node connected to an "H" level power supply through an enabling p-channel MOS transistor, and an NMOS sense amplifier constituted by a flip-flop consisting of n-channel MOS transistors for discharging the "L" level side of each of said pair of bit lines, said n-channel MOS transistors having a common source node connected to an "L" level power supply through an enabling n-channel MOS transistor, and said amplitude limiting circuit comprises a voltage generator for receiving an output from said precharge voltage generator as a reference voltage and generating an "H" level side upper limit voltage higher than the reference voltage by a desired value and an "L" level side lower limit voltage lower than the reference voltage by a desired value, two comparator means for comparing the upper and lower limit voltages with corresponding potentials of said common source nodes of said PMOS and NMOS sense amplifiers, and gate circuit means for controlling operations of said PMOS and NMOS sense amplifier enabling MOS transistors in accordance with outputs from said comparator means.

6. A DRAM according to claim 4, wherein the "H" level bit line potential amplitude and the "L" level bit line potential amplitude are given as predetermined values regardless of a power-supply voltage.

7. A DRAM comprising:

a memory array including a plurality of dynamic memory cells arranged in a matrix, a plurality of pairs of bit lines, extending in one direction of the matrix of said memory cells, for exchanging information charges with said memory cells, and a plurality of word lines, intersecting said plurality of bit lines, for selecting said memory cells;

a bit line precharge circuit including a precharge voltage generator for precharging said bit lines to a (½) power-supply voltage;

an NMOS sense amplifier arranged for each pair of bit lines and constituted by a flip-flop consisting of two n-channel MOS transistors whose sources are commonly connected to constitute a common source node;

a PMOS sense amplifier arranged for each of said pair of bit lines and constituted by a flip-flop consisting of two p-channel MOS transistors whose sources are commonly connected to constitute a common source node;

an enabling n-channel MOS transistor for commonly connecting said common source nodes of said respective NMOS sense amplifiers to a ground potential in a word line direction;

an enabling p-channel MOS transistor for commonly connecting said common source nodes of said respective PMOS sense amplifiers to a power-supply voltage in the word line direction; and a drive circuit for driving gages of said enabling n- and p-channel MOS transistors to limit a potential amplitude variation between a precharge voltage and an "H" level output of each of said pair of bit lines charged and discharged by said NMOS and PMOS sense amplifiers and to limit a potential amplitude variation between the precharge voltage and an "L" level output of each of said pair of bit lines, so that an absolute value of each of the respective potential amplitude variations are equal to each other and are also equal to a voltage value less than an absolute value of a (½) power-supply voltage.

* * * * *